(12) United States Patent
Patapoutian et al.

(10) Patent No.: US 8,838,881 B2
(45) Date of Patent: Sep. 16, 2014

(54) TRANSFER COMMAND WITH SPECIFIED SENSE THRESHOLD VECTOR COMPONENT

(75) Inventors: Ara Patapoutian, Hopkinton, MA (US); Bernie Rub, Sudbury, MA (US)

(73) Assignee: Seagate Technology LLC, Cupertino, CA (US)

( * ) Notice: Subject to any disclaimer, the term of this patent is extended or adjusted under 35 U.S.C. 154(b) by 286 days.

(21) Appl. No.: 13/410,072

(22) Filed: Mar. 1, 2012

(65) Prior Publication Data

US 2013/0232291 A1    Sep. 5, 2013

(51) Int. Cl.
*G06F 12/00*    (2006.01)

(52) U.S. Cl.
USPC .................................. 711/103; 711/E12.008

(58) Field of Classification Search
USPC .......................... 711/103; 365/185.22, 185.24
See application file for complete search history.

(56) References Cited

U.S. PATENT DOCUMENTS

| | | | |
|---|---|---|---|
| 7,821,839 B2 | 10/2010 | Alrod et al. | |
| 7,876,621 B2 | 1/2011 | Sharon et al. | |
| 7,903,468 B2 * | 3/2011 | Litsyn et al. | 365/185.24 |
| 2008/0294813 A1 | 11/2008 | Gorobets | |
| 2009/0154251 A1 * | 6/2009 | Jones et al. | 365/185.22 |
| 2010/0091535 A1 | 4/2010 | Sommer et al. | |
| 2010/0131809 A1 | 5/2010 | Katz | |
| 2011/0161775 A1 | 6/2011 | Weingarten | |

* cited by examiner

*Primary Examiner* — Yong Choe
(74) *Attorney, Agent, or Firm* — Hall Estill Attorneys at Law

(57) ABSTRACT

Various embodiments of the present disclosure are generally directed to the accessing of data in a memory, such as but not limited to a flash memory array. In accordance with some embodiments, a transfer command is received to transfer selected data between a control module and a memory module. The transfer command specifies a target address in the memory module and a sense threshold vector associated with the selected data. The sense threshold vector in the received transfer command is used to sense a programmed state of at least one solid-state memory cell at the target address responsive to the received transfer command. The transfer command may be a read or write command.

20 Claims, 6 Drawing Sheets

ERASURE BLOCKS

GARBAGE COLLECTION UNIT (GCU)

TRANSFER COMMAND WITH SPECIFIED SENSE THRESHOLD VECTOR COMPONENT

SUMMARY

Various embodiments of the present disclosure are generally directed to the accessing of data in a memory, such as but not limited to a flash memory array.

In accordance with some embodiments, a transfer command is received to transfer selected data between a control module and a memory module. The transfer command comprises a target address in the memory module and a sense threshold vector associated with the selected data. The sense threshold vector in the received transfer command is used to sense a programmed state of at least one memory cell at the target address responsive to the received transfer command.

These and other features and advantages which may characterize various embodiments can be understood in view of the following detailed discussion and the accompanying drawings.

DETAILED DESCRIPTION

Figure 1:
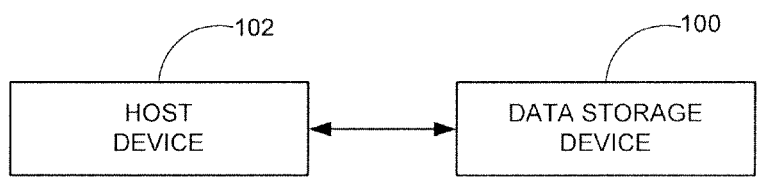
FIG. 1 provides a functional block representation of an exemplary data storage device arranged to communicate with a host device in accordance with some embodiments.

The present disclosure generally relates to data storage, and more particularly but not by way of limitation, to a method and apparatus for accessing data stored in a memory module, such as but not limited to a flash memory array of a data storage device.

A wide variety of data storage memories are known in the art. Some memories take the form of solid-state memory cells arrayed on a semiconductor substrate. Such memory cells may store data in a variety of ways such as in the form of accumulated electrical charge, selectively oriented magnetic domains, phase change material states, ion migration, and so on. Exemplary solid-state memory cell constructions include, but are not limited to, static random access memory (SRAM), dynamic random access memory (DRAM), non-volatile random access memory (NVRAM), electrically erasable programmable read only memory (EEPROM), flash memory, spin-torque transfer random access memory (STRAM), magnetic random access memory (MRAM) and resistive random access memory (RRAM).

These and other types of memory cells may be programmed to a selected state during a write operation. The programmed state may be subsequently read during a read operation. A read operation may include the application of a read voltage threshold to the associated memory cell in order to sense the programmed state.

Various embodiments disclosed herein are generally directed to improvements in the manner in which data may be transferred to and/or from a memory. As explained below, in some embodiments a control module issues a transfer command (e.g., a read or write command, or more generally an access command) to a memory module to transfer data between the control module and the memory module.

When the transfer (access) command is a read command, the command generally includes a request for data stored at a selected memory location in the memory module, as well as a specially selected sense (read) threshold vector to be used during the reading of the requested data. The memory module operates to read the data using one or more read-threshold magnitudes from the read-threshold vector and to return the read data to the control module.

When the transfer (access) command is a write command, the command generally includes a request to store certain data at a selected memory location in the memory module, as well as a specially selected sense (read-verify) threshold vector to be used during the writing of the requested data. The memory module operates to write the data and verify the written state using the supplied sense threshold vector.

In further embodiments, the control module selects the sense threshold responsive to a parametric configuration of the target address, such as aging of the data, write/erase count information associated with the target address, etc. The control module may supply a plurality of different sense threshold values to the memory module, and the memory module may supply readback data using each of these different thresholds.

In this way, the command module may more reliably read and write data, as well as obtain valuable information concerning the state of the memory module. This can promote enhanced retention threshold dithering and soft information decoding efforts.

These and other features of various embodiments can be understood beginning with a review of FIG. 1, which provides a simplified block diagram of a data system featuring a data storage device 100 coupled to a host device 102. The respective storage device 100 and host 102 can take any number of suitable forms. In some embodiments, the storage device 100 is a portable memory device mated with the host 102 to provide volatile or non-volatile memory storage for the host.

Figure 2:
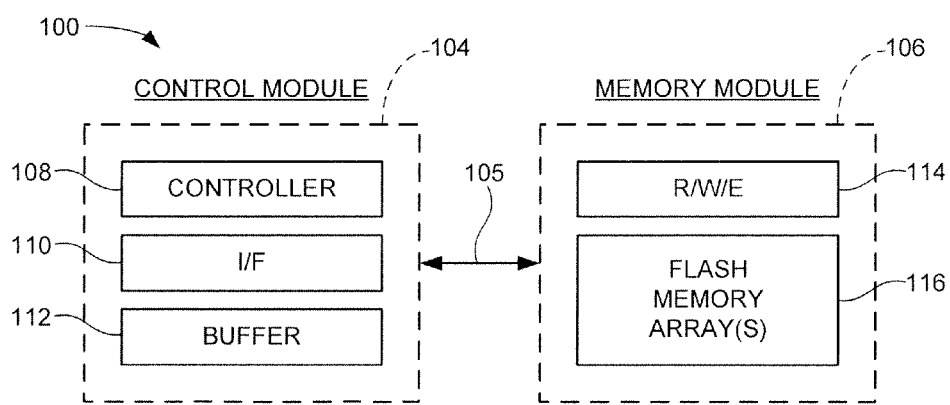
FIG. 2 shows a block diagram representation of the data storage device of FIG. 1 in accordance with some embodiments.

FIG. 2 illustrates an exemplary construction for the storage device 102 of FIG. 1 in accordance with some embodiments. The device 102 includes a control module 104 and a memory module 106. The control module 104 provides top level control for the data system, and the memory module 106 provides a main data store. The memory module 106 is adapted to receive, process and execute commands issued to it by the control module 104 across a control/memory module communication interface 105.

The respective modules 104, 106 may take a variety of forms. A solid-state drive (SSD) application may incorporate both the control module 104 and the memory module 106 in an integrated, stand-alone assembly. In a hybrid disc drive application, the memory module 106 may include both flash and disc-based memory. A memory card application may incorporate some or all of the control module functionality in the host device 102 (FIG. 1).

The exemplary control module 104 in FIG. 2 is shown to include a controller 108, an interface (I/F) circuit 110 and a memory buffer 112. The controller 108 provides overall control functions for the device 100, including directing transfers of data between the host 102 and the memory module 106. The I/F circuit 108 provides interface communications with the host and with the memory module 106. The buffer 112 can provide a storage location for programming and control data used by the controller 108 as well as temporary storage of data during data access operations. Although not specifically depicted in FIG. 2, the control module 104 may include additional functionality as well, including encryption, error detection and correction, and other signal processing capabilities.

The memory module 106 includes a read/write/erase (R/W/F) circuit 114 and one or more flash memory arrays 116. The R/W/E circuitry 114 operates to perform read, write and erasure functions upon the flash memory arrays 116 responsive to control inputs from the control module 104.

Figure 3:
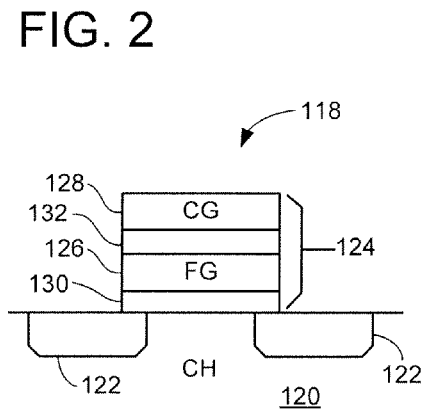
FIG. 3 shows a flash memory cell construction that can be used in the device of FIG. 1.

The flash memory arrays 116 may be formed of individual flash memory cells 118, as generally depicted in FIG. 3. The flash memory cell 118 is formed on a semiconductor substrate 120 having spaced apart n+ doped regions 122. A gate structure 124 spans the pair of adjacent doped regions so that the flash cell takes a general nMOS transistor configuration. Additional flash cells can be formed on the substrate so that each adjacent pair of the n+ doped regions 122 is provided with an associated gate structure 124, providing multiple interconnected cells.

The gate structure 124 provides an alternating stack of electrically conductive gates 126, 128 and electrically insulative regions 130, 132. Data are stored by each cell 118 in relation to the relative amount of electrical charge stored on the lower gate 126, which is characterized as a floating gate (FG).

The floating gate 126 accumulates charge during a programming operation by the selected application of appropriate voltages to the adjacent doped (drain and source) regions 122 and the upper gate 128, characterized as a control gate (CG). These applied voltages induce the controlled migration of electrical charge from a channel (CH) portion of the semiconductor substrate 120 to the floating gate 126 across insulative region 130.

In an initial erased state, there will usually be substantially no accumulated charge on the floating gate. In this state, the cell will generally tend to exhibit drain-source conductivity across the channel without the application of voltage to the control gate. Once charge has been accumulated on the floating gate, the drain-source path will be non-conductive unless a sufficiently high gate control voltage is applied to the control gate, at which point the cell becomes conductive. The programmed state of the cell can be determined by observing the level of control gate voltage required to allow drain-source current to pass through the cell, which generally correlates to the amount of accumulated charge on the floating gate.

The cell 118 can be configured as a single-level cell (SLC) or a multi-level cell (MLC). An SLC stores a single bit; a normal convention is to assign the logical bit value of 1 to an erased cell (substantially no accumulated charge) and a logical bit value of 0 to a programmed cell (presence of accumulated charge). An MLC stores multiple bits, such as two bits. Generally, n bits can be stored using $2^n$ storage states. A normal convention is to assign the multi-bit logical value 11 to an erased cell with charge C0 (substantially no accumulated charge), and then sequentially assign the remaining multi-bit logical values 10, 01 and 00 in some suitable order to increasingly higher charge levels C1, C2 and C3.

A special erasure operation is generally required to remove accumulated charge from the floating gate. An erasure can be carried by the application of a relatively high voltage to the control gate to cause migration of the charge from the floating gate back to the channel. A different set of voltages may be applied to the cell to thereafter add charge to the floating gate during a data write operation.

Figure 4:
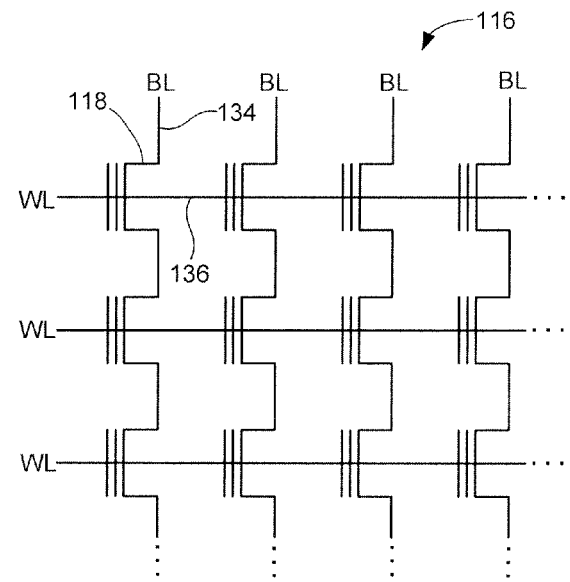
FIG. 4 is a schematic depiction of a portion of a flash memory array using the cells of 3.

Memory cells such as 118 in FIG. 3 can be arranged in the memory module 106 as an array of rows and columns of memory cells, as generally depicted in FIG. 4. Each column of adjacent cells can be coupled via one or more bit lines (BL) 134. The control gates 128 of the cells 118 along each row can be interconnected via individual word lines (WL) 136.

Figure 5:
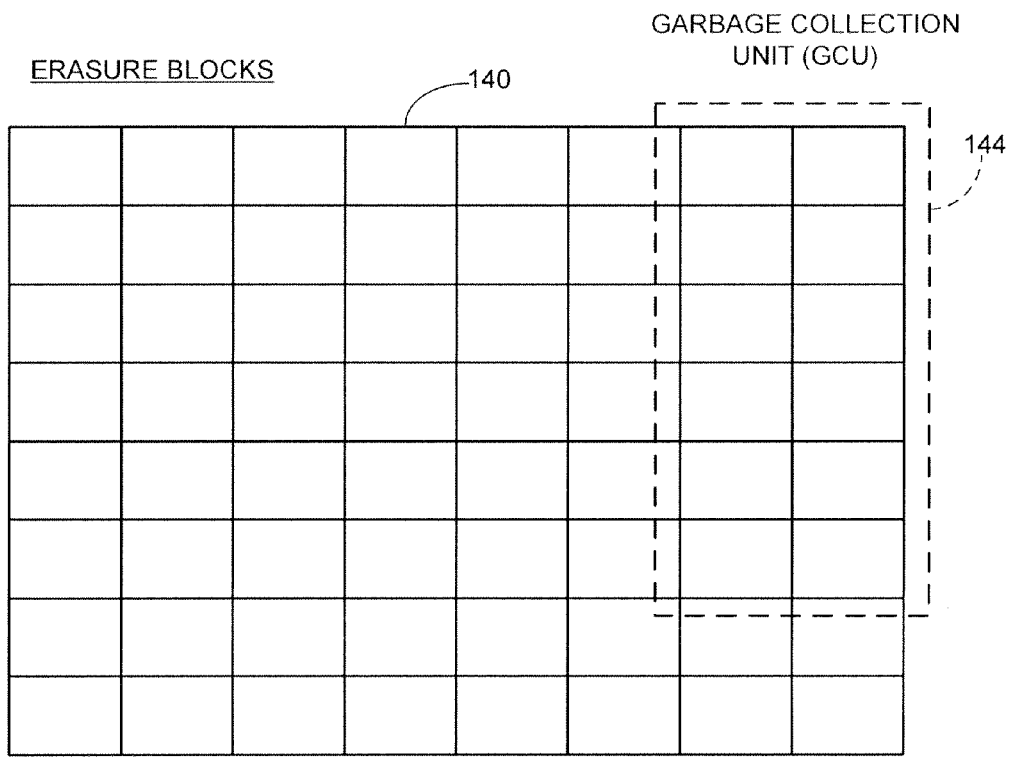
FIG. 5 illustrates an exemplary format for the flash memory array as an arrangement of erasure blocks.
Figure 6:
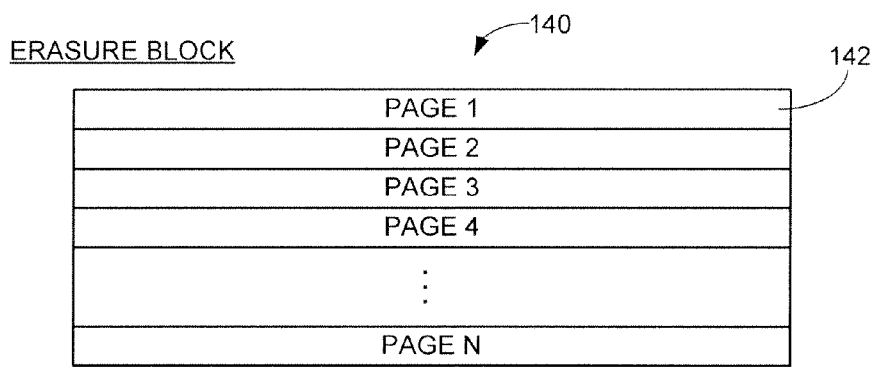
FIG. 6 shows an exemplary arrangement of one of the erasure blocks of FIG. 5.

The array of memory cells shown in FIG. 4 may be grouped into erasure blocks 140, as depicted in FIGS. 5 and 6. Each erasure block 140 may be a separately addressable block of memory and represents the smallest unit of memory that can be concurrent erased at a time. Each row of cells in an erasure block 140 may be referred to as a page 142, with each page accommodating a selected amount of user data. Block-level wear leveling may be employed to track the erase and write status of the various blocks 140. New blocks will be allocated for use as required to accommodate newly received data. In some embodiments, groups of blocks 140 may be accumulated into larger garbage collection units (GCUs) 144 which are allocated, used and erased as a unit. GCUs 144 may take any suitable size.

In at least some embodiments, a full page worth of data is written to each page at a time. Multiple user data sectors of data (each having an associated logical address, such as a logical block address, LBA) may be written to the same page. Error correction codes may be incorporated to correct errors as data are retrieved. Metadata and other control information may be stored in each erasure block 140, or stored elsewhere such as in specific blocks dedicated to this purpose.

Figure 7:
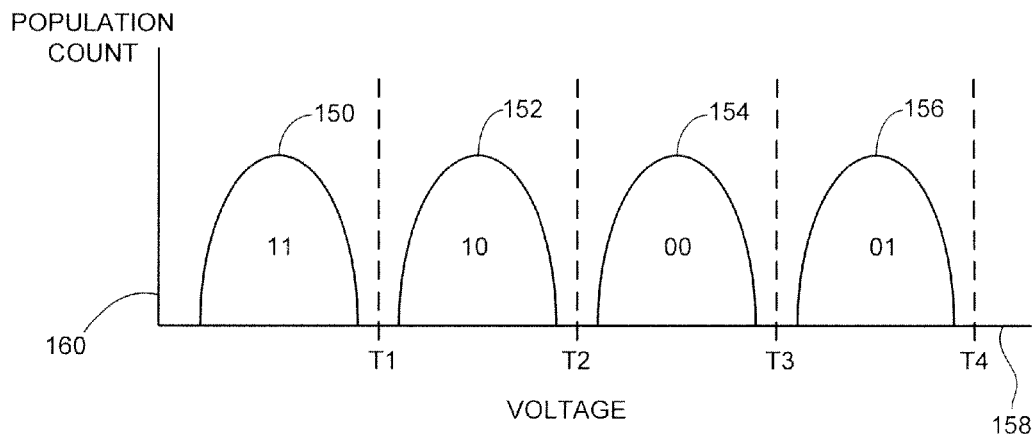
FIG. 7 shows different distributions of charge that may be stored in populations of memory cells in the array of FIG. 5.

FIG. 7 illustrates exemplary normalized charge distributions 150, 152, 154 and 156 for different levels of charge stored on the various flash memory cells 118 in the array of FIG. 5. The distributions are plotted against a common x-axis 158 indicative of voltage magnitude and a common y-axis 160 indicative of cell population count.

The distributions 150, 152, 154 and 156 represent variations about nominal accumulated charge states C0<C1<C2<C3, and correspond to MLC programmed states 11, 10, 00 and 01. Other encoding schemes can be used, including SLC encoding. Distribution 150 represents variation in the amount of charge on the memory cells in the array that have been programmed to the state 11, distribution 152 corresponds to state 10, distribution 154 corresponds to state 00, and distribution 156 corresponds to state 01. The cells in population 156 have the most accumulated charge and the cells in population 150 have the least accumulated charge.

The states 11, 10, 00 and 01 may represent data for two different pages of data stored to the cells connected to a common word line. In this case, the least significant bit (LSB) of the programmed state may provide a bit value for a first page of data, and the most significant bit (MSB) of the programmed state may provide a bit value for a second page of data.

The respective charge distributions 150-156 are ideally non-overlapping to allow the application of suitable sense threshold voltages T1, T2, T3 and T4. The sense thresholds T1-T4, also referred to as read-thresholds, serve to differentiate between the various programmed states. Threshold T1 nominally provides a voltage level sufficient to place all of the memory cells in distribution 150 into a source-drain conductive state, but insufficient to place the cells in distributions 152, 154 and 156 into a conductive state. The threshold T4 is generally large enough to place all of the cells in a conductive state irrespective of their programmed state.

The programmed state of a selected flash memory cell can be read by placing the bit line (BL) 134 (FIG. 4) for the selected cell at a suitable forward voltage (e.g., +3V, etc.), and placing the remaining non-selected bit lines (BL) at some other lower reference voltage (e.g., 0V). The non-selected word lines (WL) 136 for rows not containing the selected cell can be placed at the highest threshold T4, so that all of the cells in the selected column other than the selected cell are turned on (conductive).

One or more read-threshold voltages can be thereafter applied to the WL 136 associated with the selected cell, and the programmed state of the selected cell can be determined in relation to whether current flows through the BL 134 and the other cells in the selected column. The read operation thus assesses whether a given read-threshold voltage is sufficient to place the selected cell in a conductive state; the higher the applied voltage required to obtain current flow through the column, the higher amount of accumulated charge is present on the floating gate.

Applying the thresholds T1 and T3 from FIG. 7 to the selected cell can determine the bit value for the LSB stored by the selected cell, and applying the threshold T2 can similarly determine the bit value for the MSB stored by the selected cell. Other read sequences may be readily applied, including read operations that involve the successive application of a sequence of different thresholds, as discussed below.

The variations represented within the respective charge distributions 150, 152, 154 and 156 in FIG. 7 can arise due to a number of factors, such as but not limited to manufacturing tolerances, aging, utilization (e.g., numbers of writes/erasures/reads), electrical offsets within the R/W/E circuitry, temperature, location of the cells relative to the die (e.g., word line number), etc.

Once an individual cell has been programmed to a particular state, its charge level can subsequently decrease or increase slightly (drift) over time. The accumulated charge retained in a given cell may decrease due to the leakage of charge from the floating gate back to the channel. On the other hand, multiple read operations on a given cell, or write operations on adjacent cells, may result in a slight increase in the amount of charge on the cell, as small amounts of additional charge are added to the floating gate by these access operations.

Over time, successive writes and erasures can further tend to "wear" the cells such that, upon programming, the cells obtain a higher (or lower) amount of initial charge. This charge may further dissipate (or be added to) at a different rate than cells with a lower amount of wear. It will be appreciated that other types of solid-state memory cells STRAM, RRAM, DRAM, etc.) can similarly experience variations in programming distributions for a variety of reasons, including the factors exemplified above or other factors.

Accordingly, various embodiments contemplate the use of variable read threshold values during data access operation, with the read threshold values being specified within the data access command set. In some embodiments, read commands issued by a control module to retrieve data from a memory module (such as the respective modules 104, 106 in FIG. 2) are provided as a multi-bit word in accordance with the following format:

Read Address Read-Threshold Vector Execute where "Read" (R) signifies that the access command is a read command, "Address" (A) identifies a target address for the requested data, "Read-Threshold Vector" (T) represents one or more values associated with desired read thresholds level to be applied during the reading of the data from the target address, and "Execute" (E) signifies a command to execute the instruction. It is contemplated that the read command will be expressed as a multi-bit command word in a format suitable for processing by the memory module, with each of the components R, A, T and E expressed by a separate set of bits in the multi-bit word.

It is contemplated that the target address information supplied in the read command will be a physical address. The physical target address may be described in any suitable form such as by array, die, plane, garbage collection unit (GCU), erasure block, page, and/or bit location(s). Metadata may be referenced by the control module 104 in order to identify the target address.

In other embodiments, the target address information in the read command may be a logical address, such as a logical block address (LBA) or some other format that is translated by appropriate circuitry within the memory module 106 to identify the corresponding physical address for the most recent version of the requested data.

Figure 8:
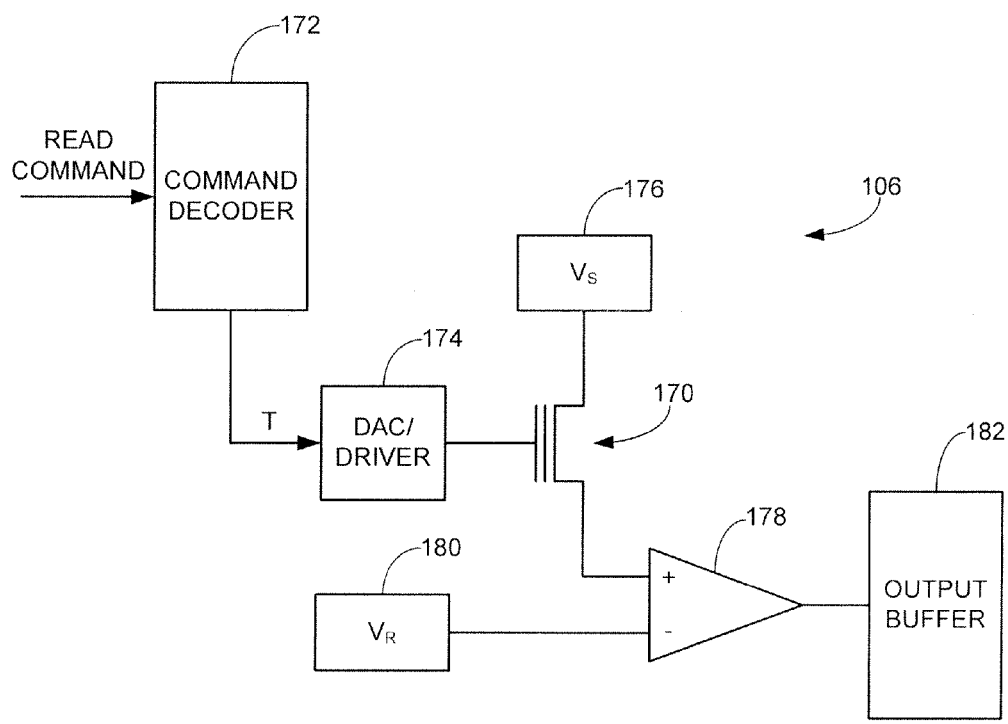
FIG. 8 shows an exemplary operation of a portion of the data storage module of FIG. 2 responsive to a read command issued by the control module of FIG. 2 in accordance with some embodiments.

FIG. 8 shows a portion of the memory module 106 that operates responsive to receipt of a read command as formatted above to carry out a read command on a target address that includes a selected flash memory cell 170. It will be appreciated that the read command may involve the reading of a plurality of such cells (such as all of the cells along a selected row in a given erasure block). For simplicity of illustration, however, the diagram of FIG. 8 will be limited to just the reading of the selected cell 170.

A command decoder block 172 receives the read command and schedules the command for processing. If multiple commands are pending, a command queue (not separately shown) may be maintained. At such time that the received read command is to be executed, the decoder block 172 supplies the threshold vector (T) value from the read command to a digital-to-analog-converter (DAC) driver circuit 174. The DAC/driver 174 converts the multi-bit digital representation of the threshold value to a corresponding analog voltage value that is supplied to the appropriate word line (WL) connected to the selected flash memory cell 170.

The bit line (BL) connected to the selected memory cell 170 is charged to an appropriate voltage ($V_S$) by a voltage source 176. The programmed state of the memory cell 170 is sensed by a suitable sense circuit, such as a sense amplifier 178 and a reference voltage source 180 that supplies a reference voltage ($V_R$), which outputs a bit representation of the stored state in an output buffer 182 in relation to whether the applied threshold value T was sufficient to place the selected cell 170 in a forward conductive state. The memory module 106 accumulates corresponding read bit values for all of the requested data in the output buffer 182, and then forwards the accumulated data to the control module 104.

The read-threshold vector value in the read command can take a variety of forms. In some embodiments, the vector is a digital value that, once processed by the DAC 174, directly corresponds to some desired analog voltage magnitude to be applied to the associated word line (e.g., 2.3V, 3.6V, etc.). In other embodiments, the read-threshold vector is a relative value that, once processed by the DAC, provides a selected interval change from a baseline value (e.g., −0.3V, +0.4V, +8%, etc.) so that the baseline value is adjusted by the threshold adjustment value to provide a final analog voltage magnitude supplied to the word line.

Figure 9:
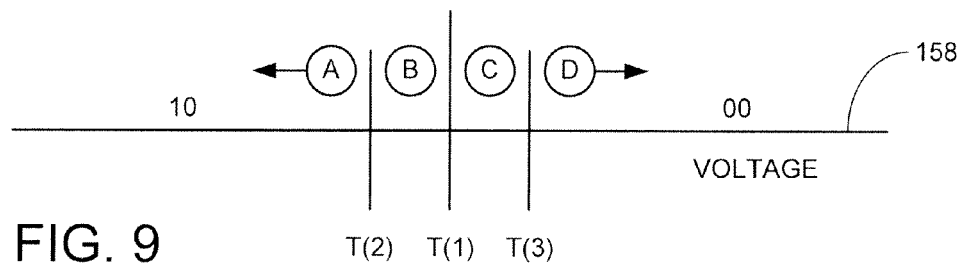
FIG. 9 illustrates different specified sense threshold values that may be issued during the read operation sequence depicted in FIG. 8.

Some exemplary read-thresholds are depicted graphically in FIG. 9. A baseline threshold T(1), a reduced threshold T(2) and an increased threshold T(3) are depicted along voltage x-axis 158 from FIG. 7, with T(1)<T(2)<T(3). While any suitable intervals can be used, including asymmetric intervals, it is contemplated in FIG. 9 that T(2)=T(1)−0.3V and T(3)=T(1)+0.3V.

The thresholds T(1), T(2) and T(3) can be used during read operations in a variety of ways. By way of illustration, consider a situation where the memory cells at the target address (A) are known by the control module 104 to have been retained at the target location for a period of time longer than some pre-established aging threshold $T_{AGE}$. The control module 104 may accordingly provide a read request with the lower read-threshold value T(2) to compensate for this age retention condition.

Alternatively, in the absence of available retention time information, the control module 104 may issue two successive read commands for the data: one that specifies the baseline threshold T(1), and one that specifies the lower threshold T(2). Depending on the charge state of the selected cell (or cells), application of the two different thresholds T(1) and T(2) may cause the memory module 106 to return the same combinations, or different combinations, of bits for the requested data.

The control module can perform signal processing analyses on the read data to reliably recover the data as well as to discover in real time the operational state of the associated target address. If application of ECC (error correction codes) processing to the data shows that the T(2) threshold provides error-free data at a rate better than ECC processing of the data obtained using T(1), the control module 104 may operate to make a determination as to the state of the target address (e.g., the target address has undergone data retention degradation, etc.).

This information may be taken into account when further data requests are made for data associated with the degraded target address. Subsequent data requests for data in the same GCU as the target address may also be provided with reduced threshold vectors. Similar analyses may suggest the use of increased threshold values (e.g., T(3)).

A read-threshold vector based read command can further be used to provide soft decoding information to the control module 104. An analog-to-digital-converter (ADC) approach can be used to obtain higher resolution reading of the data. The control module 104 may issue three read commands for the same target data, respectively specifying the read thresholds T(1), T(2) and T(3) in separate commands, e.g., Read Address T(1) Execute
Read Address T(2) Execute
Read Address T(3) Execute From the standpoint of the control module 104, the controller 108 can now consider the respective charge amounts on the target cell(s) as falling within four (4) zones: Zone A, below T(2); Zone B, between T(2) and T(1); Zone C, between T(1) and T(3); and Zone D, above T(3). These respective zones are denoted in FIG. 9. More resolution can be provided through the use of additional read thresholds.

Evaluating the returned data from the memory module 106 responsive to each of these different read commands can provide statistical information to the control module 104 regarding the variations of accumulated charge for the target address.

Figure 10:
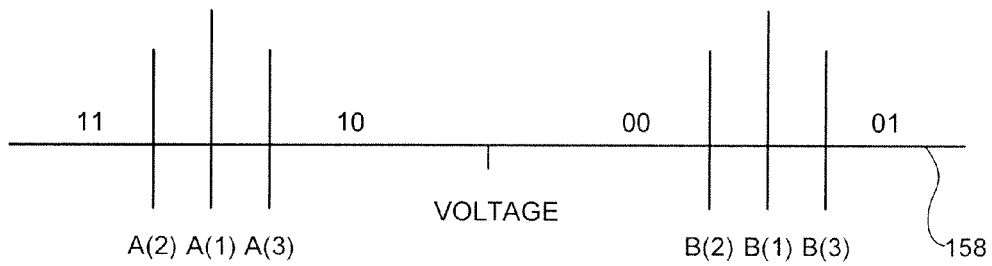
FIG. 10 illustrates further exemplary sense threshold values that may be issued during a read operation sequence.

In another example, consider different read thresholds A1-3 and B1-3 generally represented in FIG. 10. These may be used during LSB detection of the programmed states of the associated cells. To initiate a read sequence, a read command may first be issued as follows:

Read Address A(1),B(1) Execute which generally requests respective read samples from the memory module using the A(1) and B(1) thresholds in FIG. 10. A data register (REG) available to the controller 108 can be initialized to zero, and the controller can perform the operations:

REG=REG XOR (V<A(1))

followed by

REG=REG XOR (V>B(1))

so that the returned data are sequentially subjected to an appropriate logical combination operation, such as exclusive-or (XOR). An advantage of this approach is that the data can be correctly determined even if data drift has occurred in either direction. Similarly, LSB soft decoding reads can be carried out using the read thresholds in FIG. 10 by performing the following two sequential reads:

Read Address A(2),B(3) Execute
Read Address A(3),B(2) Execute

In sum, the foregoing read command sequences allow the control module 104 to perform an ADC function upon the data at the expense of slightly longer read latencies, depending on the time required to return the additional sets of requested data.

The read-threshold based access commands set forth herein can readily be adapted for use during write commands as well, such as in a write command format as follows:

Write Address Program-Verify Threshold Vector Execute where "Write" signifies a write command and "Program Verify Threshold Vector" (PV) is a value used to control the lower boundary of the recorded signal level. Those skilled in the art will appreciate that this lower boundary threshold value (PV) is a specialized form of read threshold value (T), as it is used during the programming operation to ensure adequate accumulated charge has been applied to the programmed cell.

Those skilled in the art will note that, depending on the encoding scheme employed to write the data to the memory cells, the same read-threshold value may be used to detect the data irrespective of what data bits are actually stored. For example, as discussed above a suitable value for the threshold T(2) in FIG. 7 can be used to sense the MSB and a suitable values for the thresholds T(1) and T(3) in FIG. 7 can be used to sense the LSB.

Different program-verify values, however, will generally be required depending on what data state is being written to the cells. For example, suitable values for each of the thresholds T(1), T(2), T(3) and T(4) may be required in order to facilitate the writing of data to each of the different distributions 150, 152, 154 and 156 in FIG. 7. Accordingly, it is contemplated that the use of the read-threshold vector in the context of a program-verify application will include a set of thresholds for each of the possible programmed states. Nevertheless, for purposes herein, both types of threshold values (normal read and read-verify during a write) will be considered "read-threshold" values, since both involve reading the existing programmed state of a memory cell.

Figure 11:
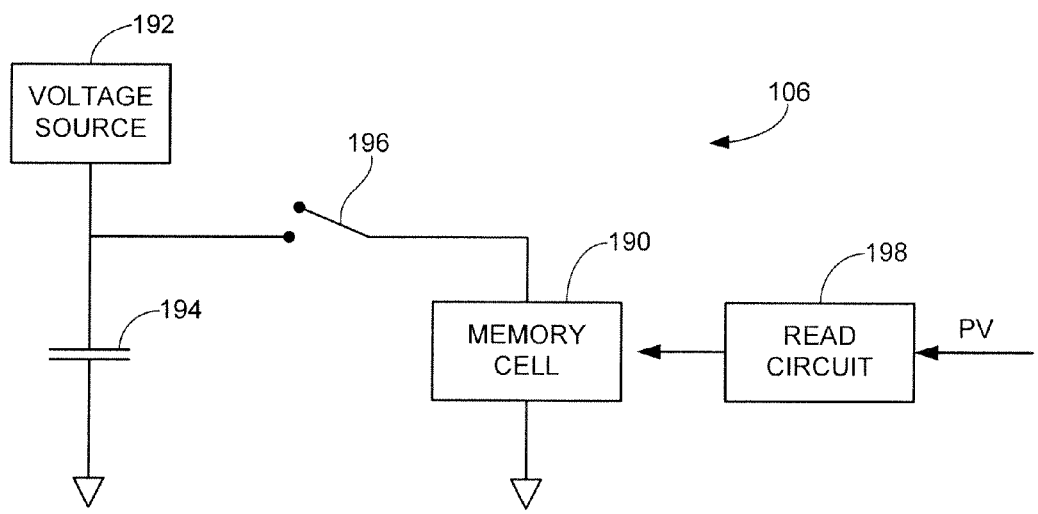
FIG. 11 depicts further portions of the exemplary data storage module of FIG. 2 during a write operation carried out in accordance with some embodiments.

FIG. 11 provides a simplified block diagram of portions of the memory module 106 that operate responsive to a write command as formatted above. Although not shown in FIG. 11, command decoding circuitry as shown in FIG. 8 can be used to process and schedule the write command at an appropriate time.

In FIG. 11, a memory cell to be programmed to a selected program state is denoted at 190. A voltage source 192 supplies a programming voltage $V_P$ to a capacitor 194 or other charge storage element. A selectively activated switch 196, which may take the form of a power MOSFET or other suitable device, periodically closes to allow the transfer of discrete quanta of accumulated charge from the capacitor 194 to the selected memory cell 190.

A read circuit 198, which may have a form that generally corresponds to the read circuitry presented above in FIG. 8, is used to periodically apply the PV read verify value specified in the write command to the cell during the accumulation of charge. In some embodiments, the program processing of FIG. 11 continues until the cell 190 no longer becomes conductive responsive to the specified PV read threshold value, at which point the programming operation on the selected cell is completed.

As desired, a separate read-verify operation can be carried out and the results returned to the control module 106. This read verify operation can be carried out by issuing a separate read command to read the data state of the programmed cell(s). This separate read command can use the same read-verify threshold as was utilized in the write command, or can be a different value. This provides immediate feedback at the desired resolution concerning the effectiveness of the program-verify values. Adjustments to both PV and T values can thereafter be made as appropriate.

Figure 12:
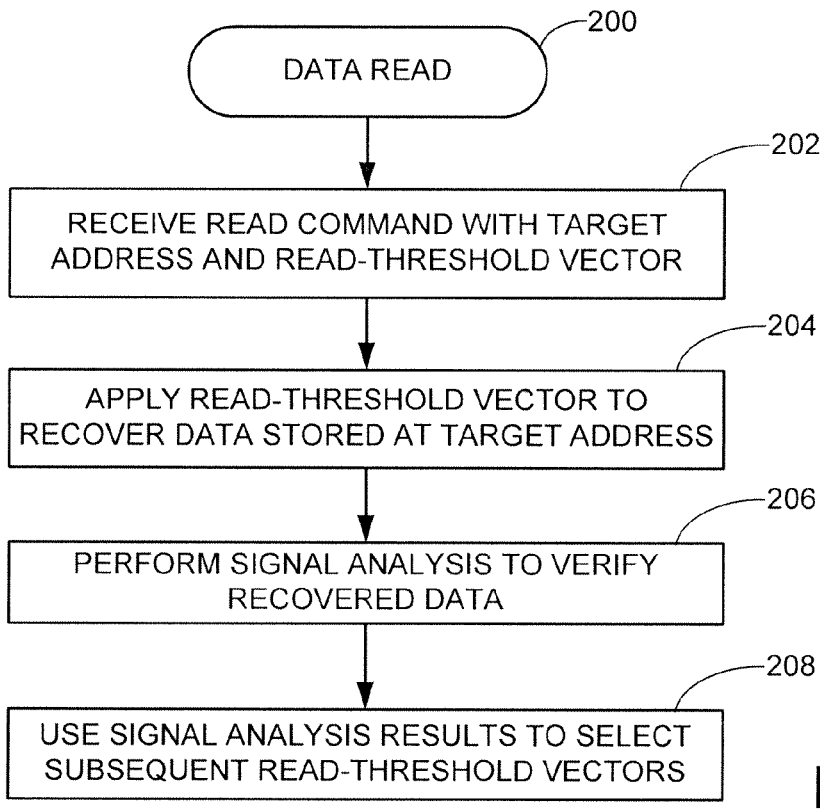
FIG. 12 is a flow chart for a DATA READ routine, illustrative of steps that may be carried out in accordance with various embodiments.

FIG. 12 provides a flow chart for a DATA READ routine 200, generally illustrative of steps that may be carried out in accordance with various embodiments. The routine is generally representative of a read command exchange involving the transfer of data from a memory module back to a control module. The exemplary flash memory based modules 104, 106 will be used as a basis for an explanation of the routine of FIG. 12, although it will be appreciated this is merely illustrative and not limiting.

As shown by step 202, a read command is provided by the control module 104 and received by the memory module 106. The read command can take a variety of forms including the various forms discussed above, and will generally include a target address (A) for the data to be recovered, and a specified read-threshold vector (T) with one or more read threshold values indicative of read-threshold values to be used during the data recovery operation.

At step 204, the memory module 106 applies the specified read-threshold vector value(s) T to the target address A to recover and return the requested read data (RD) to the control module 104. At step 206, as required the control module 104 may carry out signal processing analysis to verify the recovered data. This may include the various steps set forth above.

If the read command is responsive to a host request for the data (see e.g., host 102 in FIG. 1), the control module may further operate to transfer the recovered data to the host at this point.

At step 208, the control module may take further steps responsive to the signal analysis results of step 206 to adjust read-threshold vectors for subsequent requests, or make other parametric adjustments as required. In some embodiments, a new request may be made for the same data using a different read-threshold vector selected responsive to the returned data. In other embodiments, the control module 106 may mark certain areas of the memory array and store appropriate read-threshold vectors for future read commands directed to those areas. In still further embodiments, the control module may command a garbage collection operation or some other housekeeping operation by the memory module responsive to the signal analysis results.

Figure 13:
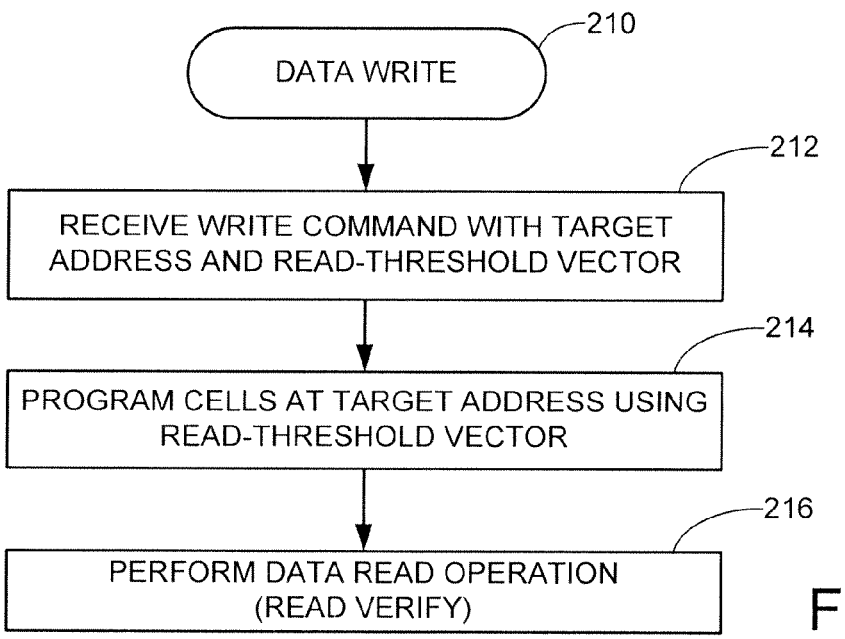
FIG. 13 is a flow chart for a DATA WRITE routine, illustrative of steps that may be carried out in accordance with various embodiments.

FIG. 13 provides a flow chart for a DATA WRITE routine 210, generally illustrative of steps that may be carried out in accordance with various embodiments. The routine is generally representative of a write command exchange involving the transfer of data from a control module to a memory module. As before, the exemplary flash memory based modules 104, 106 will be used as a basis for an explanation of the routine of FIG. 13, although such is merely illustrative and not limiting.

At step 212, a write command is issued by the control module 104 and received by the memory module 106. The memory module 106 schedules the execution of the command at an appropriate time. The write command may include a target address (A) and a program-verify (PV) type read-threshold vector with one or more read-threshold values to be used during the programming effort. The associated write data (WD) to be written to the target address may be supplied consonant with the write command.

At step 214, the memory module 106 applies the specified PV vector to write the data to the target address. The memory module 106 may supply soft decoding information to the control module 104 during this step. An optional read-verify operation may take place at step 216 using information supplied in the original write command of step 212, or in a subsequent read command. The read-verify operation verifies the programmed state using a read-threshold vector (T), which may be the same as, or different from, the PV vector. Results of the read-verify operation may be reported back to the control module 104 at this time and analyzed as before.

As desired, a separate read-verify operation may be carried out at 216, which may involve execution of the routine 200 of FIG. 12 to verify the written data. As noted above, the read-threshold vector used during the read verify step may be the same as, or different from, the program verify read-threshold vector used to program the data cells.

Prior to or during the writing of data in accordance with the routine 210 of FIG. 13, the memory module may specify a next-available memory location in its memory array to accommodate a new set of data. The control module may use this location information to specify the program-verify vector for the write event when issuing the write command at step 212.

The use of read-threshold values in data access (e.g., read and write) commands as discussed above can be readily adapted to a variety of forms of memory, such as but not limited to hybrid devices, STRAM. RRAM, PLC. MRAM, DRAM. SRAM and other types of volatile and non-volatile solid state memories. The techniques can be applied to memories that do not require a separate erasure operation, such as solid-state memory cells that can be transitioned from any selected programmed state to any other available programmed state using normal write processing instead of a specially configured erasure operation.

Figure 14:
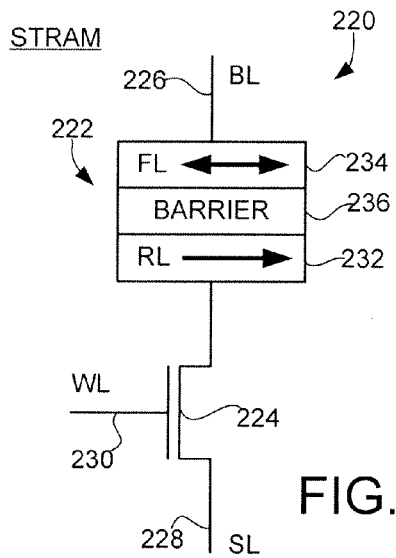
FIG. 14 represents a spin-torque transfer random access memory (STRAM) cell that may be written and read in accordance with the routines of FIGS. 12-13.

FIG. 14 depicts an exemplary spin-torque transfer random access memory (STRAM) cell 220. The cell 220 takes a 1T1R (one transistor, one resistor) configuration, although such is not necessarily required. The STRAM cell 220 includes a resistive memory element 222 characterized as a magnetic tunneling junction (MTJ), and a switching device 224 characterized as an nMOS transistor. The memory cell 220 is accessed by a number of control lines such as bit line (BL) 226, source line (SL) 228 and word line (WL) 230. Other connection configurations are contemplated such as a crosspoint array.

The MTJ 222 includes a pinned reference layer (RL) 232 having a fixed magnetic orientation and a free layer (FL) 234 having a variable magnetic orientation. The free layer 234 is separated from the reference layer 232 by an intervening tunnel barrier layer 236. Spin-torque write currents can be passed through the memory cell to set the magnetic orientation of the free layer 234 relative to the reference layer 232 to store data.

A parallel orientation in which the free layer 234 is in the same magnetic orientation as the reference layer 232 provides a relatively lower electrical resistance RL, and an anti-parallel orientation in which the free layer 234 is opposite that of the reference layer 232 provides a relatively higher electrical resistance RH.

Figure 15:
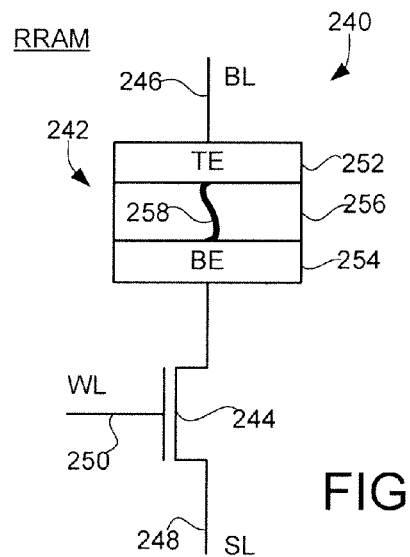
FIG. 15 represents a resistive random access memory (RRAM) cell that may be written and read in accordance with the routines of FIGS. 12-13.

FIG. 15 illustrates a resistive random access memory (RRAM) cell 240 in accordance with some embodiments. The RRAM cell 240 also takes a 1T1R configuration although such is not required. The RRAM cell 240 includes a resistive memory element 242 and a switching device 244, characterized as an nMOS transistor. The RRAM cell 240 is accessed by respective bit, word and source lines (BL, WL and SL) 246, 248 and 250.

The resistive memory element 242 includes top and bottom conductive electrodes (TE and BE) 252 and 254. These electrode layers are separated by an intervening oxide layer 256. Application of appropriate programming currents induces migration of conductive ions into the oxide layer 256 to form a conductive filament 258 that partially or completely spans the oxide layer and reduces the overall resistance of the cell. The filaments 258 can be subsequently removed by appropriate programming currents that urge migration of the ions back to the respective electrode layers. Other RRAM configurations can be utilized.

Figure 16:
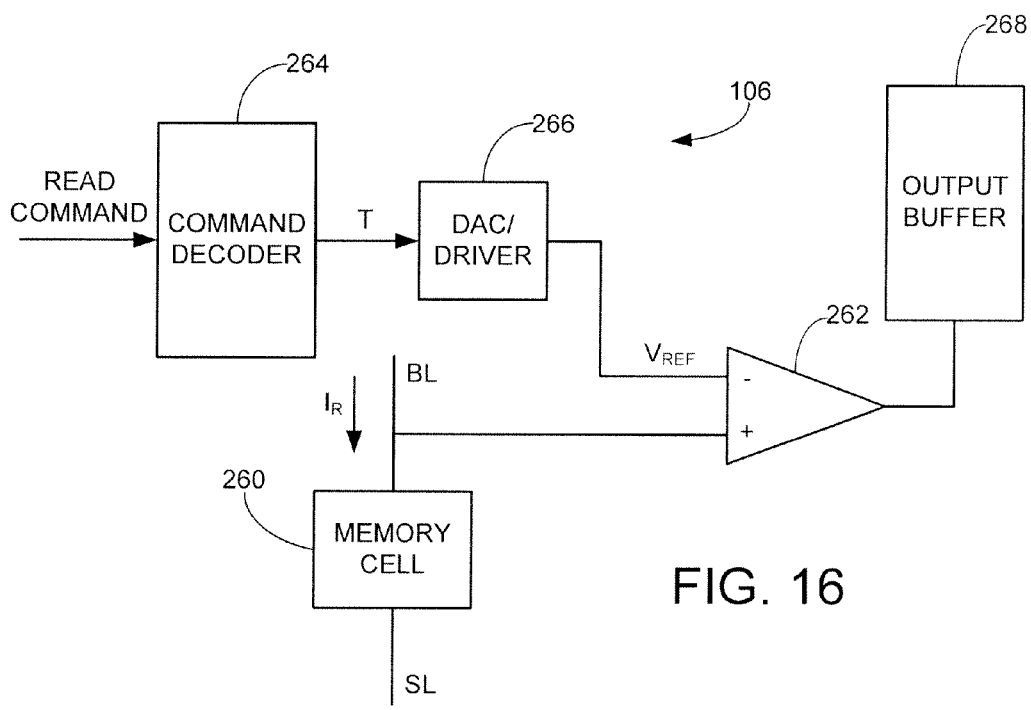
FIG. 16 shows an exemplary operation of a portion of the data storage module of FIG. 2 responsive to a read command issued by the control module of FIG. 2 in accordance with other embodiments.

FIG. 16 illustrates a resistive sense memory (RSM) cell 260 in a memory array of the memory module 106 that may be accessed by an access command in accordance with various embodiments. The memory cell 260 may take an STRAM or RRAM construction, or some other construction, and may be accessed by one or more control lines including a bit line (BL) and a source line (SL). Different programmed resistances, and hence, different programmed states of the memory cell 260 can be sensed by a sense amplifier 262 which senses a voltage drop established across the cell responsive to application of a relatively small read current ($I_R$) through the cell.

The sense amplifier 262 in FIG. 16 compares the voltage drop from the memory cell 260 to a programmable reference voltage $V_{REF}$. The programmable reference voltage magnitude may be established responsive to a read-threshold value T in a read command which is decoded by a read command decoder 264 and converted to an analog voltage by a DAC/driver circuit 266. As before, selected read-thresholds can be used during both read and write operations upon the cell 260, and the results can be stored in an output buffer 268 pending subsequent transfer to the control module and, as required, on to the host.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising
receiving a transfer command to transfer selected data between a control module and a memory module, the transfer command comprising a target address in the memory module and a specified sense threshold vector associated with the selected data, the sense threshold vector comprising different first and second sense threshold values; and
using the sense threshold vector specified in the transfer command to sense a programmed state of at least one solid-state memory cell at the target address responsive to the received transfer command by applying the first sense threshold value to obtain a first set of readback data and applying the second sense threshold value to obtain a second set of readback data, wherein the programmed state is determined responsive to the first and second sets of readback data.

2. The method of claim 1, in which the transfer command is a multi-bit word transferred from the control module to the memory module, the multi-bit word comprising a first set of bits that identify the target address and a second set of bits which identify the associated sense threshold vector.

3. The method of claim 2, in which the second set of bits identify the first and second sense threshold values within the sense threshold vector each of which are separately applied by the memory module to the at least one memory cell during the using step to transfer the respective first and second sets of readback data to the control module, the control module determining the programmed state of the at least one memory cell at the target address responsive to the first and second sets of readback data.

4. The method of claim 3, in which the control module determines the programmed state of the at least one memory cell by combining the first and second sets of readback data using a selected logical function.

5. The method of claim 1, in which the transfer command is a read command and the first and second sense threshold values are read voltages applied to a gate structure of the at least one memory cell.

6. The method of claim 1, in which the first sense threshold magnitude is a baseline value and the second sense threshold magnitude is a reduced or increased value that provides a selected interval change from the baseline value.

7. The method of claim 1, in which the at least one memory cell is characterized as a resistive sense memory (RSM) cell and the using step comprises applying of the sense threshold vector to a sense amplifier coupled to the at least one memory cell and sensing the programmed state of the RSM cell responsive to a differential voltage between the voltage magnitude and a voltage drop across the RSM cell.

8. The method of claim 1, further comprising performing a read-verify operation after the using step by receiving a read-verify command having a second sense threshold vector different from the sense threshold vector, and returning a set of data stored at the target address to the control module responsive to application of the second sense threshold vector to the at least one memory cell.

9. The method of claim 1, in which the sense threshold vector comprises first, second and third sense threshold values, the second threshold value between the first and third threshold values, the using step comprising sequentially applying the first, second and third threshold values to the at least one memory cell to provide first, second and third sets of readback data, the method further comprising sequentially transferring the first, second and third sets of readback data to the control module and using the control module to logically combine the first, second and third sets of readback data to determine the programmed state of a plurality of memory cells at the target address.

10. The method of claim 1, in which the control module transfers the transfer command to the memory module, and the control module selects the sense threshold vector responsive to an amount of time data have been stored at the target address in relation to an aging threshold associated with the target address.

11. The method of claim 1, in which the control module transfers the transfer command to the memory module, and the control module selects the sense threshold vector responsive to an accumulated number of erasures previously carried out upon the target address.

12. A memory module, comprising:
an array of solid-state memory cells each having an associated address;
write circuitry adapted to write a programmed state to said array of memory cells;
read circuitry adapted to read the programmed state of said array of memory cells; and
an address decoder adapted to, responsive to receipt of a transfer command comprising a target address in the array of memory cells and a specified sense threshold vector associated with the target address, provide the sense threshold vector specified in the transfer command to the read circuit, the read circuit using the specified sense threshold vector to verify the programmed state of the memory cells at the target address established by the write circuitry responsive to the transfer command, wherein the write circuitry terminates further programming of the memory cells responsive to the specified sense threshold vector.

13. The memory module of claim 12, in which the transfer command is a multi-bit word transferred from the control module to the memory module, the multi-bit word comprising a first set of bits that identify the target address and a second set of bits which identify the associated sense threshold vector.

14. The memory module of claim 12, in which each memory cell at the target address is adapted to be programmed to one of a plurality of different programmed states, and the sense threshold vector comprises a plurality of different magnitude program-verify values each separately used responsive to the program state being programmed.

15. A data system, comprising:
a control module comprising a controller and a data buffer; and
a memory module comprising an array of solid-state memory cells each having an associated address, read circuitry adapted to read a programmed state of said array of memory cells, and a command decoder;
wherein the control module is adapted to issue a transfer command to the memory module to effect a data transfer between the data buffer and the array, the transfer command specifying a target address in the array of memory cells and a selected sense threshold vector associated with the target address, the selected sense threshold vector comprising a plurality of different voltage thresholds; and
wherein responsive to receipt of the transfer command, the command decoder decodes the specified sense threshold vector from the transfer command and transfers said decoded vector to the read circuitry which applies said vector to at least one memory cell at the target address to sense a programmed state thereof.

16. The system of claim 15, in which the transfer command is a read command issued by the control module to return requested data from the array to a host device, wherein the sense threshold vector specified in the issued read command identifies different first and second sense threshold magnitudes, wherein the read circuitry sequentially recovers different first and second sets of readback data responsive to application of the respective first and second sense threshold magnitudes and transfers the first and second sets of readback data to the buffer, and the controller decodes the requested data for transfer to the host responsive from a logical combination of the first and second sets of readback data.

17. The system of claim 15, in which the transfer command is a write command issued by the control module to store write data from a host device to the array, wherein each memory cell at the target address is adapted to be programmed to one of a plurality of different programmed states, and the sense threshold vector comprises a plurality of different magnitude program-verify values each separately applied by the read circuit during programming of memory cells at the target address responsive to the program state being programmed to each of the respective memory cells at the target address.

18. A method comprising:
receiving a transfer command to transfer selected data between a control module and a memory module, the transfer command comprising a target address in the memory module and a specified sense threshold vector associated with the selected data; and
using the sense threshold vector specified in the transfer command to sense a programmed state of at least one solid-state memory cell at the target address responsive to the received transfer command, wherein the at least one memory cell is a resistive sense memory (RSM) cell and the using step comprises applying a voltage magnitude of the sense threshold vector to a sense amplifier coupled to the at least one memory cell and sensing the programmed state of the RSM cell responsive to a differential voltage between the voltage magnitude and a voltage drop across the RSM cell.

19. The method of claim 18, in which the transfer command is a multi-bit word transferred from the control module to the memory module, the multi-bit word comprising a first set of bits that identify the target address and a second set of bits which identify the associated sense threshold vector.

20. The method of claim 19, in which the second set of bits identify two distinct sense threshold voltage magnitudes within the sense threshold vector each of which are separately applied by the memory module to the at least one memory cell during the using step to transfer respective first and second sets of readback data to the control module, the control module determining the programmed state of the at least one memory cell at the target address responsive to the first and second sets of readback data.

* * * * *